United States Patent [19]

Koblinger et al.

[11] Patent Number: 5,055,383

[45] Date of Patent: Oct. 8, 1991

[54] PROCESS FOR MAKING MASKS WITH STRUCTURES IN THE SUBMICRON RANGE

[75] Inventors: Otto Koblinger, Korntal-Munchingen; Klaus Meissner, Ammerbuch-Altingen; Reinhold Mühl, Altdorf; Hans-Joachim Trumpp, Bernhausen; Werner Zapka, Gartringen-Rohrau, all of Fed. Rep. of Germany

[73] Assignee: International Business Machines Corporation, Armonk, N.Y.

[21] Appl. No.: 420,870

[22] Filed: Oct. 12, 1989

[30] Foreign Application Priority Data

Nov. 17, 1988 [EP] European Pat. Off. ........ 88119094.6

[51] Int. Cl.⁵ .......................................... H01L 21/76
[52] U.S. Cl. ....................................... 430/312; 430/5; 430/316; 430/317
[58] Field of Search .................... 430/5, 312, 316, 317; 156/644, 643, 659.1

[56] References Cited

U.S. PATENT DOCUMENTS

| | | | |
|---|---|---|---|
| 3,201,239 | 8/1965 | Neugebauer et al. | 96/36 |
| 3,700,433 | 10/1972 | Duhl | 148/32.5 |
| 4,209,349 | 6/1989 | Ho et al. | 148/187 |
| 4,331,708 | 5/1982 | Hunter | 427/93 |
| 4,354,896 | 10/1982 | Hunter | 156/643 |
| 4,397,937 | 8/1983 | Clecak et al. | 430/192 |
| 4,502,914 | 3/1985 | Trumpp et al. | 156/643 |
| 4,648,937 | 3/1987 | Ogura et al. | 156/643 |

FOREIGN PATENT DOCUMENTS 0223032 7/1984 European Pat. Off. .
0280587 3/1986 European Pat. Off. .

OTHER PUBLICATIONS

IBM Technical Disclosure Bulletin, vol. 27, No. 5, Oct. 1984, "Process for Structuring a Submicron Mask", by H. J. Trumpp, pp. 3090-3091.

European Search Report EP 88 11 9094.

Primary Examiner—Charles L. Bowers, Jr.
Assistant Examiner—Thorl Chea
Attorney, Agent, or Firm—Jeffrey L. Brandt

[57] ABSTRACT

In the course of the process for making masks with structures in the submicrometer range, initially structures of photoresist or polymer material with horizontal and substantially vertical sidewalls are produced on a silicon substrate covered with an oxide layer. This is followed by a layer of silicon nitride which is deposited by LPCVD. The resultant structure is planarized with a photoresist which is etched back until the start of the vertical edges of the sidewall coating formed by the nitride layer is bared on the photoresist structures. In a photolithographic step, a trimming mask is produced on the surface of the nitride layer and the planarizing resist. The bared regions of the nitride layer are then removed by isotropic etching. The dimensions A-B of the openings defined after removal of the nitride layer from the vertical surfaces of the photoresist structures are transferred to the oxide layer by anisotropic etching. Concurrently with these structures of minimum line width, registration marks are generated which allow the adjustment necessary for a further photolithographic step to be carried out with maximum accuracy. After removal of the trimming mask, the planarizing resist, the photoresist structures and the remainder of the nitride layer, structures with coarser line widths are defined in a further photolithographic step, which are also transferred to the oxide layer. Using the oxide layer as a mask, trenches of the desired depth are produced in the silicon substrate by anisotropic etching. The mask is thinned by anisotropic etching, and the oxide layers are removed from the front and the back side by wet etching.

14 Claims, 5 Drawing Sheets

5,055,383

PROCESS FOR MAKING MASKS WITH STRUCTURES IN THE SUBMICRON RANGE

This invention concerns a process for making masks with structures in the submicron range.

BACKGROUND OF THE INVENTION

In the future, the miniaturization of components in integrated circuits will necessitate the production of structures with dimensions that are far below 1 $\mu$m. The masks used in the processes previously employed for the production of such submicrometer structures were fabricated by direct write electron or ion beam lithography. Such processes allowed the fabrication of lithographic masks with a field of, say, 5×5 mm (size of a chip field) and minimum line widths of about 0.5 $\mu$m.

As in the future much larger chip fields with still finer structures will be produced, the larger masks required for this purpose will have to be fabricated with matching accuracy. However, for direct write electron beam exposure systems the writable field size is limited by field inhomogeneities and by the desired finer line widths, since at a constant number of address points, the spacing of the latter and thus the writable field decreases for smaller line widths. Therefore, larger fields can only be produced by successively writing several smaller fields and stitching them together to form a larger field. For this purpose, the individual fields must adjoin each other with maximum accuracy to avoid that positioning errors occurring during field stitching exceed about ⅓ of the minimum line width. On the whole, the fabrication of masks for future highly integrated circuits will lead to an increasing number of positioning errors owing to the finer structures, the resultant smaller writable field, the desired larger mask field, and the larger number of joints per mask (chip) field, respectively, so that it is doubtful whether it will be possible to fabricate masks for future lithography on a 1:1 scale.

Processes for producing structures with dimensions in the submicrometer range by using structures of polymer material with vertical sidewalls are described in the European Patent 0 111 086 (EPA 83109945.2). These processes differ from the present invention taught below.

SUMMARY OF THE INVENTION

It is the object of the present invention to provide a process for making masks, wherein the finest line widths to be written are produced in the mask as a hole pattern by sidewall technology, and wherein arbitrary line structures in the mask are produced in a photolithographic step by means of a direct write electron or ion beam write tool or by optical exposure.

By means of the process according to the invention, line patterns with a minimum width of about 0.1 $\mu$m may be reliably produced by sidewall technology in a first process cycle. In the same cycle, registration marks are produced in the mask, with the aid of which further mask exposure may be effected at maximum superposition. In a second cycle, the mask may be provided with arbitrarily shaped line structures of widths exceeding about 0.5 $\mu$m, using, for example, electron beam lithography.

The process according to the invention is used to produce structures of polymer material with vertical sidewalls on an oxide layer on top of a silicon substrate, in which the desired mask is to be made. The sidewalls serve to form sidewall structures of silicon nitride or oxide with dimensions in the submicrometer range. In a highly precise copying process, the original dimension of the sidewalls is transferred to the oxide layer on the substrate. The resultant structured oxide layer acts as a mask for etching trenches into the substrate. Then, the structures whose dimensions are less critical are produced in the mask in a second lithographic process.

BRIEF DESCRIPTION OF THE DRAWING

The invention will be described in detail below with reference to the drawings in which.

DETAILED DESCRIPTION OF THE INVENTION

Figure 1A:
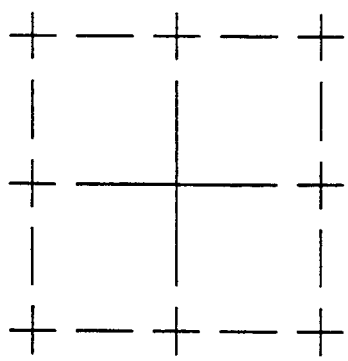
FIG. 1A shows a mask consisting of several fields.
Figure 1B:
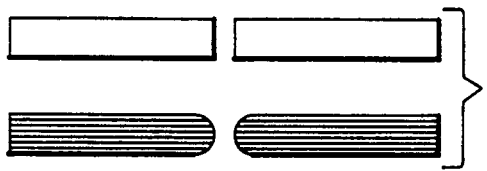
FIGS. 1B, C show printed line patterns of different widths and the associated resist patterns.
Figure 1C:
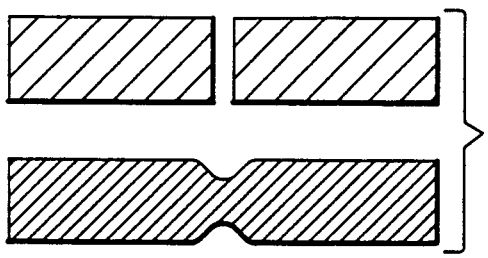
Figure 2:
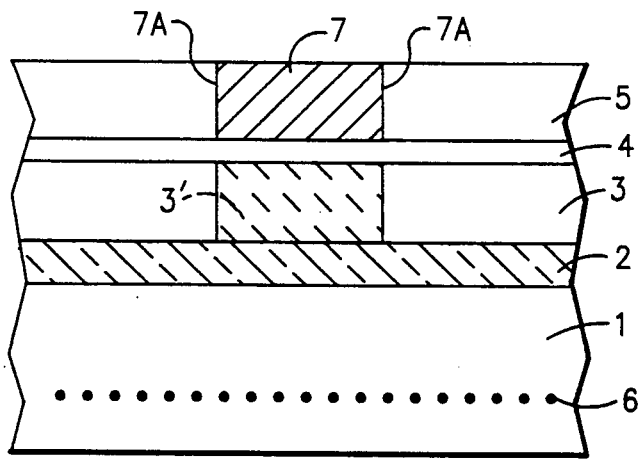
FIGS. 2 to 7 show the 1st cycle of the process according to the invention for producing finest line widths.
Figure 3:
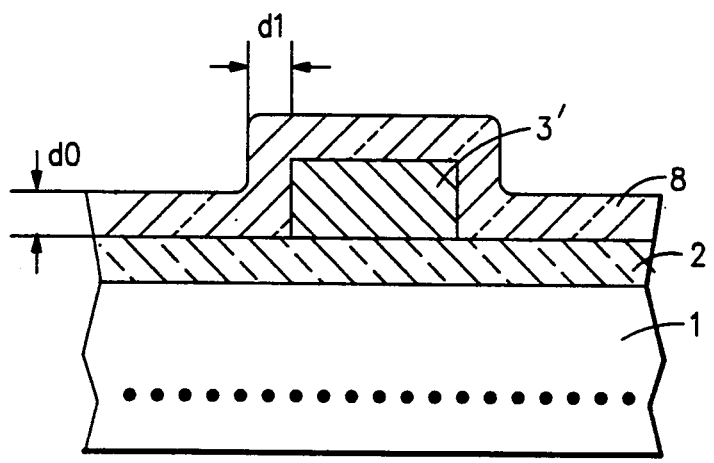

FIG. 1A shows a mask, whose field is stitched from four smaller fields. Superposition errors occurring during the stitching of the individual mask fields are particularly detrimental to sensitive finest lines of about 0.25 $\mu$m width. In practice, such errors may occur when several smaller fields are stitched together to form a larger chip field, which may lead to interruptions of, say, the very fine word/bit lines arranged on the chip in raster fashion. In the present case, FIG. 1B (top) shows the printed pattern of a fine line. If this pattern is interrupted, for example, by a superposition error, the resultant resist pattern (FIG. 1B, bottom) will also be interrupted. With coarser lines, an interruption of the printed pattern (FIG. 1C, top) will merely lead to a constriction of the resultant resist pattern in the respective region, as shown in FIG. 1C (bottom). If, in the latter case, the line width is reduced by about ⅓, the structure will still be serviceable. Line interruptions occurring during the stitching of fine lines are caused by the low magnitude of double exposure between two lines. For wider lines, the magnitude of double exposure between two lines is much higher, so that, as a rule, the regions in between that are not directly exposed are also "opened", leading to a constriction rather than to an opening. The process according to the invention allows fine lines that are particularly sensitive to superposition errors to be produced by large-scale optical lithography, thus avoiding the errors shown in FIG. 1B.

The making of a mask is described in detail below with reference to FIGS. 2 to 9 (FIGS. 10A to 10E). According to FIG. 2, a layer (2) of dielectric material is applied by standard processes to a silicon semiconductor substrate (1). Layer (2) may be made of silicon dioxide, for example. It may also consist of a double layer.

For the process according to the invention, substrate (1) consists of monocrystalline silicon with a thickness of about 400 to 600 $\mu$m, preferably about 400 $\mu$m. The back side of this substrate is provided with an about 0.5 to 1 $\mu$m thick silicon dioxide layer (not shown). The front side of the substrate is doped with a P+ conductivity producing dopant, such as boron, up to a doping limit (6) at a depth of about 2 to 4 μm. The thickness of the doped layer is defined as the spacing from the substrate surface at which the doping concentration drops to about $7 \times 10^{19}$ atoms/cm$^3$.

Boron diffusion acts as an etch barrier when the silicon wafer is thin etched later on, thus defining the mask thickness. The boron concentration also produces a tensile stress in the finished mask which prevents a bending of the mask when it is heated in its rigid cold silicon frame. Initially, several windows of chip size are etched on the back side by conventional photolithography and wet etching. The wafer is later on etched through these windows. On the front side of the silicon substrate (1) thus prepared, an oxide layer (2) is thermally grown at about 800° CC in an oxygen or oxygen/water ambient.

For producing the photoresist or polymer structure, the surface of the oxide layer (2) is covered with an about 1 to 2 μm thick polymer or resist layer (3) by spinning or spraying, followed by a curing step at about 200° C. for about 30 minutes. There are many materials of which the layer (3) may be produced. Such materials may be known positive and negative photoresist materials, such as the usual phenolformaldehyde novolak resins, polymethyl methacrylate, polyisoprenes or materials as are described in the U.S. Pat. Nos. 3,201,239 and 3,700,433. Polymer materials that are not sensitive to radiation, such as polyimide, may also be used to form the layer (3).

In the process according to the invention, layer (3) consists of a TNS photoresist which is described in the U.S. Pat. No. 4,397,937 and which is based on a phenolic resist and a diester of a 1-oxo-naphthalene sulfonic acid with an unsymmetrical primary or secondary alphatic diol as a sensitizer. The layer thickness is about 1.1 μm. Layer (3) is cured as previously described.

Next, a silicon nitride layer (4) with a thickness of about 0.1 μm is deposited on layer (3) as an etch barrier for reactive ion etching with oxygen. The silicon nitride is applied by plasma deposition (LPCVD) from an atmosphere containing silane, ammonia and argon at a pressure of about 1 mbar, a deposition temperature of about 200° C., and a power of about 100 Watt.

Overlying the plasma nitride layer (4) a photoresist layer (5) of a thickness of about 0.5 to 10.0 μm is deposited as the top-most layer. For the method according to the invention, this layer consists of the same photoresist as the resist layer (3). It may also be made of another photoresist that is highly sensitive to radiation.

By imagewise exposure at a wavelength of 436 nm, followed by a curing step in nitrogen at a temperature ranging from about 95° to about 105° C. for about 30 minutes, and development in an aqueous AZ developer on the basis of tetramethyl ammonium hydroxide, layer (5) is provided in a known manner with a desired pattern (7) having vertical sidewalls (7A). Pattern (7) is then transferred by dry etching to the nitride layer (4) and the resist layer (3), with transfer to the silicon nitride layer (4) being effected by plasma etching with CF$_4$ at a flow rate of about 20 to about 50 sccm, a pressure of about 30 to about 60 μbar and an energy density of about 0.3 to about 0.5 Watt/cm$^2$, with an overetch of about 30%. The endpoint of etching is determined by laser interference.

The layer (4) with the etched holes is used as a mask to etch the photoresist layer (3). The etch medium is oxygen at a flow rate of about 40 to about 60 sccm, a pressure of about 2 to about 10 μbar and an energy density of about 0.2 to about 0.4 Watt/cm$^2$. To obtain steep resist or polymer sidewalls, it is advantageous for the reactive ion etch step to be carried out at a low oxygen pressure of about 2 μbar. Then, the plasma nitride layer (4) is removed from the structure (3') in a suitable RIE process which selectively etches the PECVD nitride with respect to oxide and photoresist and which uses CF$_4$ and O$_2$ at a flow rate of 100 sccm for CF$_4$ and 8 sccm for O$_2$, a pressure of about 265 μbar and an energy density of less than about 0.1 Watt/cm$^2$. The nitride may also be removed by etching with a hot phosphoric acid. The resultant structure (3') has a width D exceeding/equalling about 1.0 μm, with D being the future line spacing. Upon being exposed later on in an electron beam printer by E-beam proximity printing (EBP), the mask made by the process according to the invention may be staggered by fractions of D to further reduce the minimum line spacing on the wafer, i.e., to increase the integration density. For the same purpose, a further mask may be used.

Figure 10A:
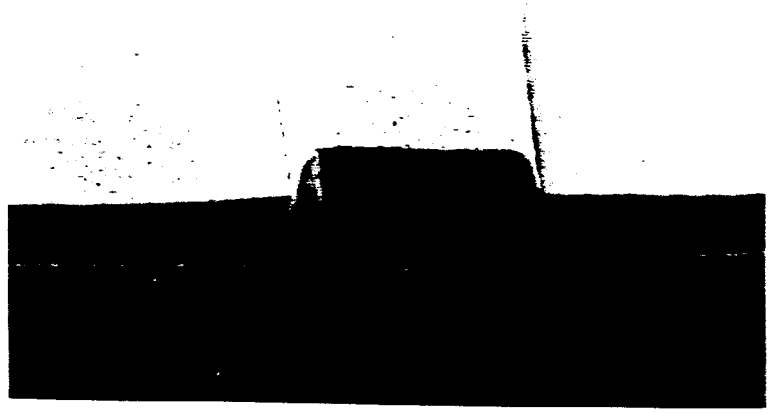
FIGS. 10A to 10E are secondary electron or raster electron micrographs corresponding to FIGS. 4 to 8.

The structure (3') serves to define the position and the height of the nitride sidewalls to be produced in the subsequent process steps. According to FIG. 3, the silicon nitride (8) is deposited with a layer thickness of about 100 to 500 nm from a plasma of an atmosphere containing silane, ammonia and argon, at a pressure of about 1 mbar, a temperature of about 210° C. and a power of 100 Watt. The silicon nitride (8) covers all horizontal and vertical surfaces of the structure (3') and the oxide layer (2). The thickness $d_1$ on the vertical surfaces is slightly less than the thickness $d_o$ on the horizontal surfaces, and amounts of about $0.8 \times d_o = d_1$ determines the line width of the desired finest structures. Then, for planarizing the structure of FIG. 3, a photoresist layer (9) is deposited on the entire surface with a thickness of about 2 to 4 μm. For this purpose, a photoresist as previously described in conjunction with the production of the layers (3) and (5) (FIG. 2) may be used. The photoresist is cured by radiation with UV light (say, of a wavelength of 436 nm) and by heating to about 150° to about 180° C. for 30 minutes. Then, the resist layer (9) is removed to such an extent that the start of the perpendicular edge of the sidewall coating of the resist structure (3') (character A, FIG. 4) is bared. Removal is carried out by reactive ion etching in oxygen at a flow rate of about 50 sccm, a pressure of about 30 μbar and an energy density of about 0.2 to 0.4 Watt/cm$^2$. FIG. 10A (secondary electron or raster electron micrograph) corresponds to FIG. 4 and shows the sidewall of silicon nitride (8) on top of the structure (3') as well as the remainder of the planar resist (9).

Although the nitride sidewalls produced by sidewall technology have the desired submicrometer dimensions, they are closed structures. Therefore, they have to be opened and split, respectively. A process used for this purpose is described, for example, in IBM Technical Disclosure Bulletin, Vol. 27, No. 5, October 1984, pp. 3090-91, H. J. Trumpp, "PROCESS FOR STRUCTURING A SUBMICRON MASK".

Figure 4:
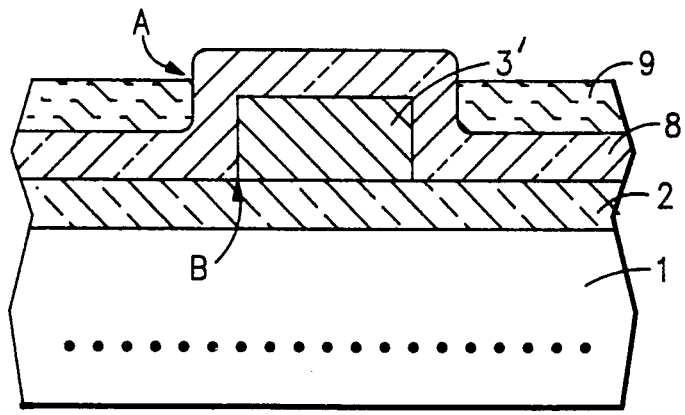
Figure 5:
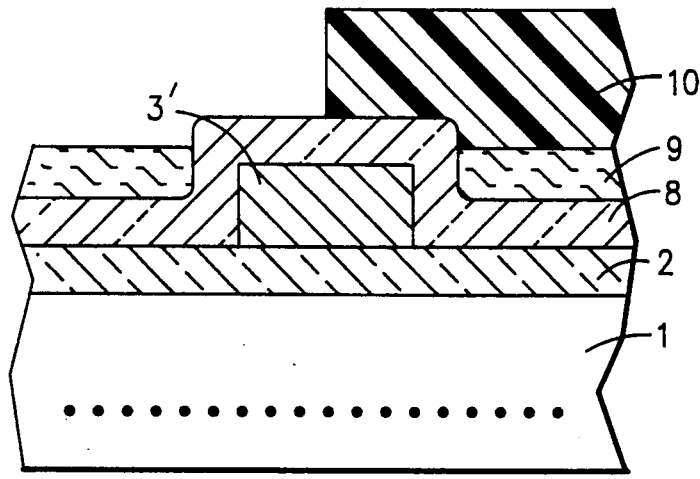
Figure 6:
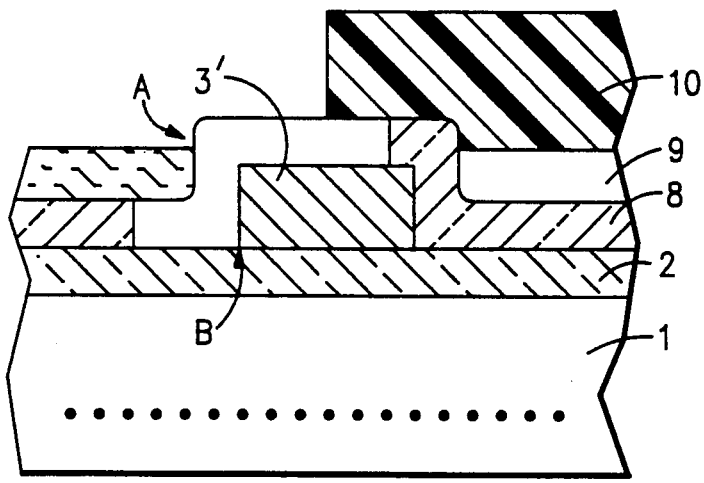
Figure 10B:
Figure 10C:
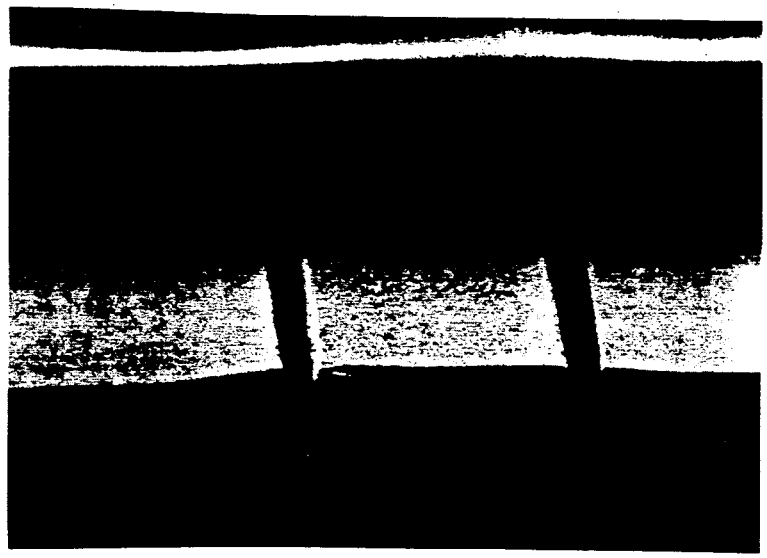

For producing open structures, the invention provides for a photoresist layer (10) to be deposited on the planarized structure of FIG. 4. The resist layer is exposed in a known manner and developed, yielding the trimming mask (10), FIG. 5. FIG. 10B corresponding to FIG. 5 shows the trimming mask on top of the nitride layer (8).

In the next process step, the horizontal and vertical regions of the nitride layer (8), which are not covered by the trimming mask (10) are removed by isotropic etching. In particular the vertical region of the nitride layer is removed without changing its dimensions, and the trimming mask (10) and the planar resist (9) are laterally undercut, since the etch process used is an isotropic one. This step consists of reactive ion etching in $CF_4$ with 8 vol% oxygen, at a flow rate of 20 sccm, a pressure of about 30 μbar and an energy density of about 0.2 Watt/cm$^2$, or of plasma etching in a system of LFE-Corporation with $CF_4$ at a flow rate of 100 sccm, a pressure of about 100 μbar and a power of about 200 Watt. The resultant structure is shown respectively in FIG. 6 and FIG. 10C.

Figure 7:
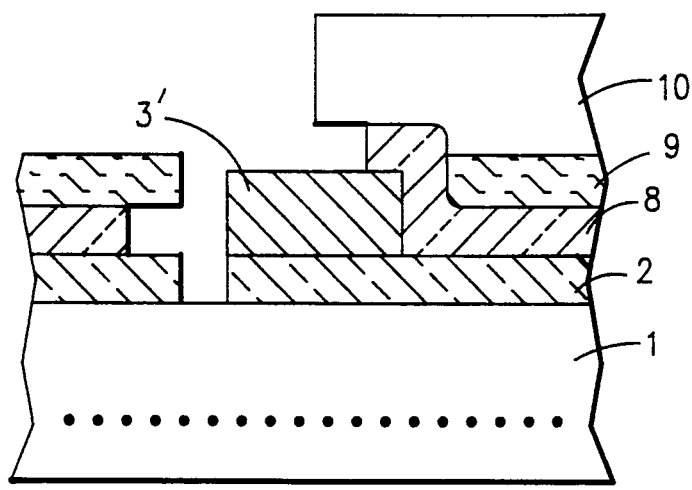
Figure 10D:
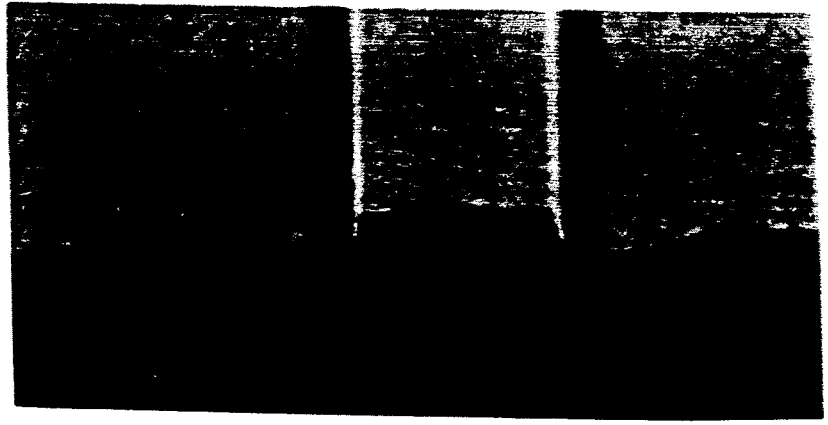

In a further process step, the actual mask opening for etching the substrate (1) is produced in the dioxide layer (2). For this purpose, the opening, whose dimensions are defined by the spacing A-B (FIG. 6) is highly accurately transferred to the oxide layer (2) by reactive ion etching with $CF_4$ or $CHF_3$ at a flow rate of 30 sccm, a pressure of 50 μbar and an energy density of 0.1 to 0.3 Watt/cm$^2$. The resultant structure is shown in FIG. 7 and FIG. 10D, respectively. Finally, the trimming mask (10) and the remainder of the planarized resist layer (9) are removed by plasma etching in oxygen at a flow rate of 100 sccm, a pressure of 100 μbar and an energy density of 0.2 to 0.5 Watt/cm$^2$. The plasma nitride (8) on top of the oxide layer (2) is removed by reactive ion etching with $CF_4/O_2$ at a flow rate of 100 sccm for $CF_4$ and 8 sccm for $O_2$, a pressure of about 265 μbar and an energy density <0.1 Watt/cm$^2$. The structure (3') is removed by plasma etching, using oxygen as previously described.

Concurrently with the structures of minimum line width, registration marks are produced in the mask, by means of which the mask may be exposed further with maximum superposition in a second process cycle. The registration marks consist of a large number of periodically arranged squares with an edge length of about 1 μm. As they are produced by sidewall technology, these squares are surrounded in the oxide by trenches of minimum line width. As the registration signal in the EBP process is produced by scattering electrons on topographic structures, in this case on trenches and oxide surfaces, the signal train is sufficient for highly precise registration.

The structure, from which the trimming mask (10), the planarizing resist (9), the structure (3'), and the plasma nitride (8) have been removed, is provided in a second cycle of the process according to the invention with a further photoresist layer. The photoresist may be a material similar to that used to produce the layers (3) and (5) in the first process cycle. The desired pattern in the photoresist layer is produced by a direct write electron or ion beam which provides the resist layer with structures of a line width of, say, 0.5 to 1.5 μm or above that may be produced without any problem whatsoever. Coarser structures, which are common to many chips or wafers, may also be produced by optical exposure. The desired structures in this photoresist layer are positioned between the structures of minimum line width produced in the oxide layer (2) by sidewall technology in the first process cycle. The alignment of the electron beam relative to the registration marks produced in the first process cycle is known and need not be described in detail.

After a curing step, the exposed photoresist layer is developed in an alkaline aqueous developer, yielding the desired pattern. The field size which is limited for the direct write electron beam exposure process is of secondary importance to the second process cycle, since, owing to the greater line widths written in this cycle, individual fields for making a mask of the desired size may be stitched without problems. In this context, attention is again drawn to the previously described FIG. 1C showing that at greater line widths, in contrast to resist patterns with minimum line widths, an interruption of the line pattern to be printed merely leads to a constriction in the resultant resist pattern but not to an interruption of lines. The above-described steps of the second process cycle are not graphically represented.

Figure 8:
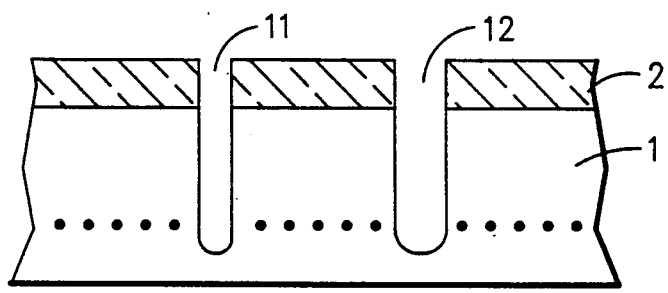
FIG. 8 shows a silicon dioxide mask with holes of different diameters and trenches etched in the silicon substrate.
Figure 10E:

The pattern in the further photoresist layer is also transferred to the oxide layer (2) by reactive ion etching. The structured oxide layer with openings for line widths $d_1 << 0.5$ μm and openings for line widths $d_2 > 0.5$ μm acts as a mask for the reactive ion etching of the silicon substrate (1). In this step, trenches (11, 12) are etched into the silicon substrate (1). Reactive ion etching is carried out with HCl gas as an etch medium at a flow rate of 80 to 120 sccm, a pressure of 40 to 110 μbar and an energy density about 0.3 Watt/cm$^2$. This etch step is effected in an AME 8300 reactor. An AME 5000 reactor may also be used. However, the etch parameters depend on the respective reactor employed. The depth of the etched trenches exceeds the doping limit (6) in the silicon substrate (1). The resultant structure is shown in FIG. 8. FIG. 10E shows trenches (11) with minimum line width in a silicon substrate (1).

Figure 9:
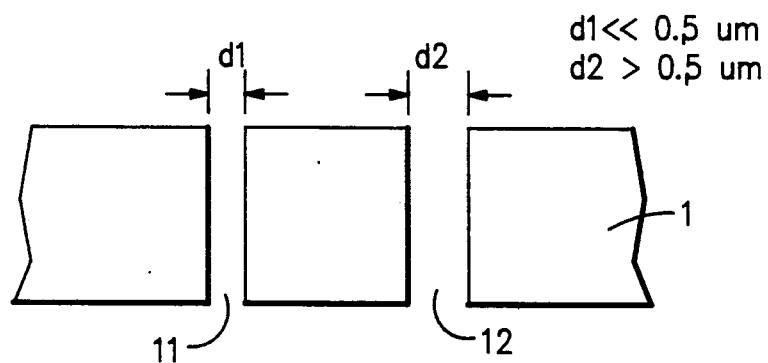
FIG. 9 shows the finished mask after the first and the second cycle of the process according to the invention.

Then, the silicon substrate (1) is anisotropically wet etched through the openings in the silicon dioxide layer (not shown) on the back side of the wafer. The etch solution used for this purpose consists of ethylene diamine, pyrocatechol and water. Etching stops at a boron concentration of $7 \times 10^{19}$ boron atoms/cm$^3$. The resultant mask of the monocrystalline boron-doped silicon membrane is about 2 μm thick, depending upon the boron diffusion used. The silicon dioxide layers are removed from both sides of the substrate by etching with buffered hydrofluoric acid. The resultant mask is shown in FIG. 9. The silicon membrane is subsequently coated with a 0.2 to 0.8 μm thick gold layer (not shown). The gold layer is capable of decelerating an electron beam up to energies of about 25 keV.

The masks made by the process according to the invention may be used in an electron beam printer by means of which patterns with such dimensions are transferred to photo-resist-coated wafers by electron beam proximity printing.

What is claimed is:

1. A process for making a structure including features in the submicron dimension range comprising the steps of:
   a) providing a substrate;
   b) forming a first layer of material on said substrate;
   c) forming a mesa including at least one vertical surface on a selected region of said first layer;
   d) forming a second layer of material over said mesa and the uncovered portions of said first layer, said second layer forming a sidewall over each vertical surface of said mesa;
   e) forming a planarizing layer on said second layer, said planarizing layer leaving uncovered the top of said second layer on said mesa;

f) forming a mask on said second and planarizing layers, said mask leaving uncovered the top of a sidewall;

g) removing the uncovered sidewall with an isotropic etchant to form a first pattern defining a submicron dimension;

h) transferring said first pattern to said first insulting layer;

i) removing said mask, planarizing layer, second layer, and mesa to leave said first layer defining said first pattern;

j) photolithographically defining a second pattern on said first layer;

k) transferring said second pattern to said first layer; and transferring said first and second patterns from said first layer into said silicon substrate.

2. A method in accordance with claim 1 wherein said step of forming said mesa includes the steps of:

forming a bottom layer of photoresist or polyimide over said first layer;

forming a middle layer of silicon dioxide or silicon nitride over said bottom layer;

forming a top layer of photoresist over said middle layer;

exposing and developing said top layer of photoresist to define said mesa; and transferring said mesa first to said middle layer, then to said bottom layer.

3. A method in accordance with claim 2 wherein:

said bottom layer is about 1.1 μm in thickness and comprises a resist based on phenolic resin with a diester of a 1-oxo-2-naphthalene sulfonic acid with an unsymmetrical primary or secondary alphatic diol as a sensitizer;

said middle layer comprising silicon nitride about 0.1 μm in thickness; and said top layer comprising a photoresist in the range of about 0.5–1.0 μm in thickness.

4. A process in accordance with claim 3 wherein:

said mesa is transferred from said top layer to said middle layer by reactive ion etching using a $CF_4$ plasma; and said mesa is transferred from said middle layer to said bottom layer by reactive ion etching using oxygen.

5. A process according to claim 1 wherein said substrate comprises a monocrystalline silicon with a thickness of about 400 to 600 μm which is doped with a P+ conductivity producing dopant.

6. A process according to claim 1, wherein said first layer comprises a thermally grown silicon dioxide.

7. A process according to claim 1 wherein said second layer comprises silicon nitride with a thickness of about 100 to 500 nm.

8. A process according to claim 1 wherein said step of forming said planarizing layer comprises the steps of:

depositing a layer of photoresist material conformally over said second layer and said mesa; and blanket etching said last-recited layer of photoresist material until the start of a sidewall is uncovered.

9. A process according to claim 1 wherein said first pattern is defined by the spacing formed by removing the second layer sidewall from the vertical surface of the mesa.

10. A process according to claim 1 and further including the step of forming, concurrently with the first pattern, registration marks in said first layer.

11. A process according to claim 1 wherein said step of transferring said first pattern to said first layer is performed using reactive ion etching.

12. A process according to claim 1 wherein said step of transferring said first and second patterns to said substrate is performed using reactive ion etching.

13. A process according to claim 1 and further including the step of thinning said substrate from the back side.

14. A process according to claim 1 and further including the step of removing said first layer from said substrate.

* * * * *